(12) United States Patent
Ando

(10) Patent No.: US 6,825,112 B2
(45) Date of Patent: Nov. 30, 2004

(54) SEMICONDUCTOR DEVICE AND METHOD OF PRODUCTION THEREOF

(75) Inventor: Masateru Ando, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/335,389

(22) Filed: Dec. 31, 2002

(65) Prior Publication Data
US 2003/0102561 A1 Jun. 5, 2003

Related U.S. Application Data

(62) Division of application No. 09/471,625, filed on Dec. 24, 1999, now Pat. No. 6,531,778.

(30) Foreign Application Priority Data
Dec. 28, 1998 (JP) ........................................ 1998-373210

(51) Int. Cl.$^7$ .......................................... H01L 21/4763
(52) U.S. Cl. ....................................... 438/638; 438/639
(58) Field of Search ............................... 438/622, 638, 438/700, 701, 637, 639; 257/773, 774, 760

(56) References Cited
U.S. PATENT DOCUMENTS 4,352,724 A * 10/1982 Sugishima et al. .... 204/192.37
5,073,516 A * 12/1991 Moslehi ...................... 438/429
5,476,807 A * 12/1995 Lee et al. .................... 438/396
5,512,785 A * 4/1996 Haver et al. ................. 257/758
5,731,242 A * 3/1998 Parat et al. .................. 438/586
6,156,664 A * 12/2000 Gau ........................... 438/696

FOREIGN PATENT DOCUMENTS

JP 06-224310 8/1994
JP 07-122518 5/1995

OTHER PUBLICATIONS

Office Action dated Nov. 5, 2002 from the Korean Patent Office.
Japanese Translation of the above–mentioned document.
English Translation of the Indicated portions of the above–metioned Japanese Translation.

* cited by examiner

Primary Examiner—David S. Blum
(74) Attorney, Agent, or Firm—Darryl G. Walker; Bradley T. Sako

(57) ABSTRACT

A semiconductor device and method of manufacture are provided wherein a contact hole can be formed with increased contact area while maintaining sufficient isolation between an electroconductive layer deposited in the contact hole and an adjacent wire. According to one embodiment (100), a double-layered side-wall insulating layer can be formed within a contact hole (116). The upper (second) side-wall insulating layer (120) can be etched back to expose part of the lower (first) side-wall insulating layer (118) formed in the bottom of the contact hole (116). Subsequently, the exposed portion of the first side-wall insulating layer (118) can be subject to a wet etch to remove the portion of the first side-wall insulating layer (118) at the bottom of the contact hole (116).

20 Claims, 7 Drawing Sheets

SEMICONDUCTOR DEVICE AND METHOD OF PRODUCTION THEREOF

This application is a divisional of patent application Ser. No. 09/471,625 filed Dec. 24, 1999, issued as U.S. Pat. No. 6,531,778 on Mar. 11, 2003.

TECHNICAL FIELD

The present invention relates generally to semiconductor devices and methods of production thereof, and more particularly to semiconductor devices having contact holes and methods of production thereof.

BACKGROUND OF THE INVENTION

Semiconductor integrated circuits continue to become more highly integrated. As integration increases, the size of integrated circuit elements, for example transistors, can become increasingly small. As elements become smaller, the spacing between adjacent elements, such as conductive lines or "wires," can become smaller too. Smaller spacing constraints can result in decreased spacing margins for a contact hole that is to be formed between and/or adjacent to wires. This will be explained with reference to FIGS. 12 and 13.

FIGS. 12 and 13 illustrate spacing margins for two examples of a contact hole 1200. The contact hole 1200 is formed in two interlayer insulating films, shown as 1202 and 1204, and can expose a diffusion layer 1206. Wires, shown as 1208, are formed between the interlayer insulating layers (1202 and 1204), and a contact hole 1200 is formed between the wires 1208.

It is noted that FIG. 12 illustrates a contact hole 1200 having a smaller diameter than the contact 1200 of FIG. 13.

Typically, the formation of a contact hole 1200 can include certain minimum requirements. First, the diffusion layer 1206 should be sufficiently exposed to allow contact with the diffusion layer 1206. Second, wires 1208 should be sufficiently isolated from an electroconductive layer (not shown) that is to be deposited into the contact hole 1200. Ideally, such requirements meet particular absolute values. In reality, however, due to process and other variations, a certain amount of variation is typically accounted for in order to meet such requirements in a practical sense.

FIGS. 12 and 13 include particular measurements. Measurement "a1" represents the exposed area of diffusion layer 1206. Measurement "b1" represents the distance between the wall of the contact hole 1200 and a wire 1208. It is desirable to have a large "a1," value, because a larger exposed area of a diffusion layer can lead to lower contact resistance. One skilled in the art would recognize that lower contact resistance can lead to faster and/or lower power semiconductor devices. Of course, if the value a1 was zero, it would fail the requirements described above. Typically, a value a1 must meet a minimum value, or have a certain margin to account for variations in the size of features introduced by the fabrication process.

It is also desirable to have a large "b1" value. The larger the value of "b1," the larger the distance between the internal wall of contact 1200 and wire 1208. A larger such distance "b1" can result in reduced risk of a short-circuit condition (short) between an electroconductive layer formed in the contact hole 1200 (not shown) and a wire 1208. A shorter such distance "b1" can result in an increased risk of a short between an electroconductive layer (not shown) and a wire 1208. Such an increased risk is not desirable. Of course, if b1 was zero, it would fail the requirements described above.

As in the case of the value a1, the value b1 must typically meet a minimum value, or have a certain margin to account for variations in the size of features introduced by variations in the fabrication process.

Meeting the various requirements of a contact can be complicated because, as shown in FIGS. 12 and 13, the values a1 and b1 have a "trade-off" relationship with respect to one another. In particular, if the value b1 (i.e., the distance between the internal wall of contact hole 1200 and a wire 1208) is made larger, the resulting a1 value (i.e., the exposed area of diffusion layer 1206) can be smaller. This relationship is shown in FIG. 12. Conversely, if the value a1 (i.e., the exposed area of diffusion layer 1206) is made larger, the resulting value b1 (i.e., the distance between the internal wall of contact hole 1200 and a wire 1208) can be smaller. This relationship is shown in FIG. 13.

FIGS. 14 and 15 show profiles of a semiconductor device after an electroconductive layer 1210 is deposited into a contact hole 1200. FIGS. 14 and 15 can be considered to correspond to FIGS. 12 and 13, respectively.

A number of countermeasures have been proposed to further prevent a short between an electroconductive layer deposited in a contact hole and an adjacent wire. Such countermeasures include a side-wall contact structure or tapered contact structure. The examples of FIGS. 12–15 set forth examples of a side-wall contact structure and a tapered contact structure. Accordingly, a side-wall contact structure and a tapered contact structure will now be described with reference to FIGS. 12–15.

A side-wall contact structure includes a side-wall insulating film formed on the internal wall of a contact hole 1200, and is shown in FIGS. 12–15 as item 1212. In such a structure, if a contact hole 1200 was formed in such a way that it would result in a value b1 of zero (namely, opening the contact hole 1200 would expose a wire 1208) side-wall 1212 could serve to intervene between a wire 1208 and an electroconductive layer 1210 deposited into a contact hole 1200, preventing a short between the two. The side-wall contact structure is shown in Japanese Patent Application Laid-Open No. 10-144788.

In a tapered contact structure, the internal wall of a contact hole 1200 is not vertical, but inclined. Consequently, the closer the contact hole 1200 is to the bottom, the smaller the area of the contact. This is illustrated in FIGS. 12–15, which show contact holes 1200 that are larger toward the top than toward the bottom. Consequently, because the tapered contact has a smaller area as it proceeds deeper toward the bottom of the contact, the distance b1 (between the wall of the hole 1200 and wire 1208) can be larger than the case where a contact hole is essentially cylindrical. This can lead to increased spacing margins and/or increase the resulting boundary between the internal wall of a contact hole and an adjacent wire.

In the conventional cases described above, side-wall contact structures and tapered contact structures can be employed to prevent shorts between an electroconductive layer 1210 and a wire 1208. Unfortunately, both structures tend to reduce the resulting exposed area a1 of the diffusion layer 1206.

In more detail, in the case of the side-wall contact structure, the resulting side-wall 1212 can cover the diffusion layer 1206. In particular, the exposed diffusion layer 1206 is covered by the thickness of side-wall 1212 on all sides.

In the case of the tapered contact structure, the internal wall of a contact hole 1200 has an inclined surface.

Obviously, as the internal surface is inclined, the resulting exposed area of diffusion region 1206 becomes smaller.

As can be seen from the above description, while the employment of a side-wall contact structure and/or a tapered contact structure can be effective in reducing shorts between an electroconductive layer 1210 and an adjacent wire 1208, such approaches can also be accompanied by corresponding reductions in the exposed area a1 of the diffusion layer 1206. As noted above, this can lead to undesirable increases in contact resistance.

In light of the above drawbacks in conventional approaches, it would be desirable to arrive at a semiconductor structure, and method of production thereof, that can prevent shorts between an electroconductive layer 1210 and an adjacent wire 1208, while at the same time exposing a larger portion of a diffusion layer.

SUMMARY OF THE INVENTION

According to one embodiment of the present invention, a semiconductor device can include an interlayer insulating film formed over a semiconductor substrate that includes a contact hole formed therein. A side-wall film can cover a portion of the internal surface of the contact hole. An electroconductive layer can be formed in the contact hole over the side-wall film. A side-wall insulating film can preferably include a laminated structure that includes two side-wall insulating films, including a first side-wall insulating film and a second side-wall insulating film that can have different etch rates.

According to one aspect of the embodiments, the electroconductive layer can preferably connect a diffusion layer in the substrate and a capacitive electrode formed on the interlayer insulating film. Preferably, a portion of the internal surface of the contact hole can face the electroconductive layer while another portion can face the diffusion layer.

According to another aspect of the embodiments, the interlayer insulative film can preferably have a laminated structure that includes a first interlayer insulative film and a second interlayer insulative film. A wire layer can be formed between the first interlayer insulative film and the second interlayer insulative film.

According to another embodiment of the invention, a semiconductor device includes a substrate having a diffusion layer formed therein, an interlayer insulative film formed over the substrate, a contact hole formed through the interlayer insulative film to expose at least a portion of the diffusion layer. A first side-wall insulating film can cover the internal surface of the contact wall, and not completely cover the interlayer insulating film. A second side-wall insulating film can cover the first side-wall insulating film. An electroconductive layer can fill the contact hole. Preferably, the first and second side-wall films can have different etch rates when subjected to a particular etch. Preferably, the interlayer insulating film can have a laminated structure having first and second side-wall insulating films. A wire layer can be formed between the interface of the first and second side-wall insulating films.

According to one embodiment, a method of manufacturing a semiconductor device can include forming a diffusion layer in a semiconductor substrate, forming an interlayer insulating film on the substrate, forming a contact hole through the interlayer insulating film and exposing the diffusion layer, forming a first side-wall insulating film that covers the internal surface of the contact hole and the exposed diffusion layer, forming a second side-wall insulating film that covers the first side-wall insulating film. The method may further include removing at least a portion of the second side-wall insulating film that covers the diffusion layer thereby exposing a portion of the first side-wall insulating film. A portion of the first side-wall insulating film over the diffusion layer can be removed with a wet etch.

According to one aspect of the embodiment, removing at least a portion of the second side-wall insulating film includes exposing a lateral surface of the first side-wall insulating film and exposing the diffusion layer by removing portions of the first and second side-wall insulating layers over the diffusion layer.

According to one aspect of the embodiment, removing at least a portion of the second side-wall insulating film includes exposing the top surface of the first side-wall insulating film without substantially removing the portion of the first side-wall insulating layer that covers the diffusion layer.

DETAILED DESCRIPTION OF THE EMBODIMENTS

A semiconductor device according to an embodiment of the present invention, and a method for manufacturing such a device will now be described.

Figure 1:
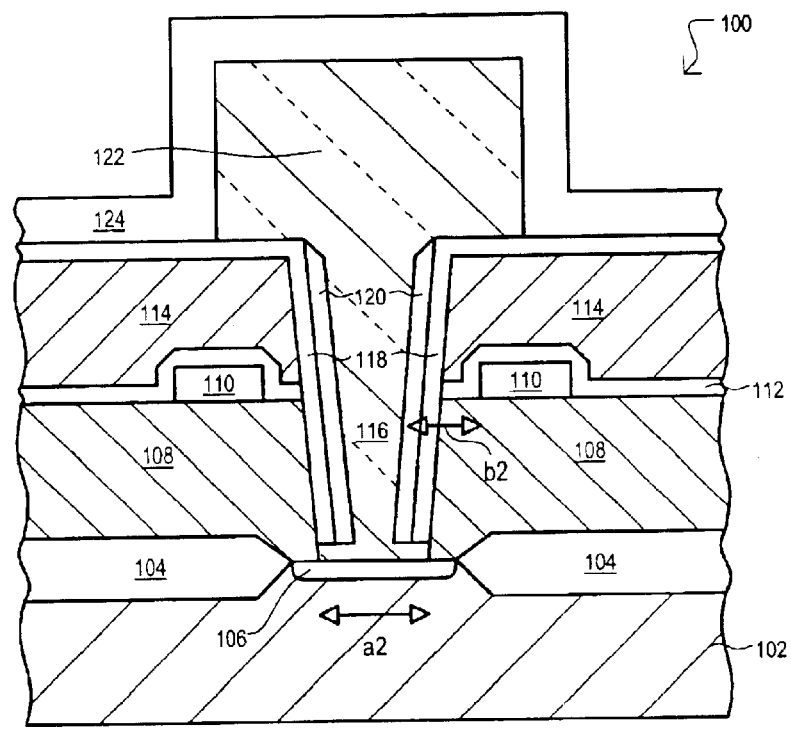
FIG. 1 is a side cross-sectional view of a semiconductor device according to one embodiment of the present invention.

Referring now to FIG. 1, semiconductor device according to an embodiment is set forth in side cross-sectional view. The semiconductor device is designated by the general reference character 100 and is shown to include a contact hole that can be isolated from adjacent wires. The contact hole includes a double-layered side-wall insulating layer that can isolate a contact hole from adjacent wires. The double-layered side-wall insulating layer is removed at the bottom of the contact hole, allowing for a larger contact area.

In particular, FIG. 1 includes a substrate 102 on which is formed a field oxide film 104. The substrate 102 includes a diffusion layer 106. A first interlayer insulating film 108 is formed over the substrate 102. Further, wires 110 are formed over the first interlayer insulating film 108. A silicon dioxide film 112 is formed over the wires 110, and a second interlayer insulating layer film 114 is formed on the silicon dioxide film 112.

One skilled in the art would recognize that a diffusion layer 106 may be formed in the substrate 102 by ion implanting and/or diffusing impurities into the substrate 102.

FIG. 1 further includes a contact hole 116 formed through the second interlayer insulating film 114, silicon dioxide film 112, and first interlayer insulating film 108 to the substrate 102. A first side-wall film 118 is formed over the second interlayer insulating film 114 and into the contact hole 116. A second side-wall film 120 is also formed on the sides of the contact hole 116. An electroconductive layer 122 is formed in the contact hole 116. Still further, in the particular arrangement of FIG. 1, an overlying electrode 124 can be formed over the electroconductive layer 122.

Having described a contact structure according one embodiment 100, a method for manufacturing such a contact structure will now be described in a series of figures and described steps.

It is understood that while the particular semiconductor device of the present invention is not limited to any particular type of device, the various manufacturing steps will be discussed with reference to a process that may form a dynamic random access memory (DRAM) device, in particular, a DRAM device having a DRAM cell with a capacitive contact.

The various drawings set forth can represent a contact to a switching transistor in a DRAM cell. The contact can connect a source/drain diffusion layer and a capacitive electrode. The particular view presented by the drawings can be a cross-sectional view cut in parallel to the word line direction of the DRAM. The cut is between word lines, thus a word line (which can function as the gate electrode of switching transistors) is not shown in the various views.

Figure 2:
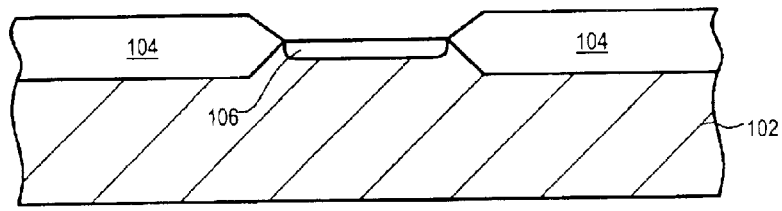
FIGS. 2 to 11 are side cross-sectional views illustrating various steps in a method of a manufacture according to the present invention.

An explanation of a method of manufacturing a semiconductor device according to the present invention will now be given. Referring to FIG. 2, an isolation layer 104 may be selectively formed in a substrate 102. In one particular arrangement, the substrate 102 may be p-type silicon, and the isolation layer 104 may be a "field oxide" of silicon dioxide formed by a local oxidation of silicon (LOCOS) method. While the present invention is not limited to such a value, a field oxide may have a thickness in the general range of 400 nanometers (nm), as but one example.

A gate insulator layer (not shown) may also be formed in an active region within substrate 102, bounded by the isolation layer 104. In one particular arrangement, the gate insulator layer may include silicon dioxide formed by the thermal oxidation of the substrate 102. While the present invention is not limited to such a value, a gate insulator layer may have a thickness in the general range of 12 nm, as but one example.

A conductive gate layer (not shown) may then be formed over the surface of the device. The conductive gate layer may then be patterned according to photolithographic techniques to form gate electrodes that may be situated over the gate insulator layer. In one particular arrangement, the conductive gate layer may include polycrystalline silicon (polysilicon). While the present invention is not limited to such a value, a conductive gate layer may have a thickness in the general range of 200 nm, as but one example.

Transistor source and drain regions may then be formed in the substrate 102. In one arrangement, a source and drain region may be a diffusion layer 106. In one particular arrangement, with gate electrodes serving as a mask, an impurity, such as phosphorous or others, can be implanted into the substrate 102 to form an n-type diffusion layer 106. As noted above, a diffusion layer 106 may be the source/drain region of a switching transistor in a DRAM device.

Figure 3:
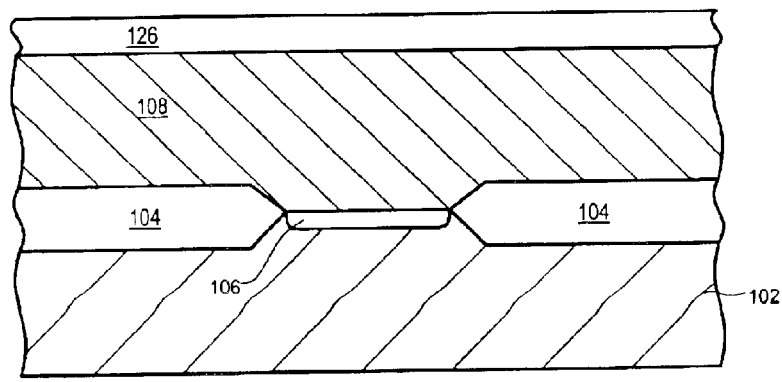

Referring now to FIG. 3, immediately thereafter, a first interlayer insulating film 108 can be formed over the surface of the device. In one particular arrangement, the first interlayer insulating film 108 can include borophosphosilicate glass (BPSG) formed with tetraethylorthosilicate as a source material (TEOS-BPSG). While the present invention is not limited to such a value, a first interlayer insulating film may have a thickness in the general range of 300 nm. The first interlayer insulating film may subsequently be treated to improve surface flatness.

As also shown in FIG. 3, a conductive wire layer 126 may be formed over the first interlayer insulating film 108. In one particular arrangement, a conductive wire layer can include polysilicon.

Figure 4:
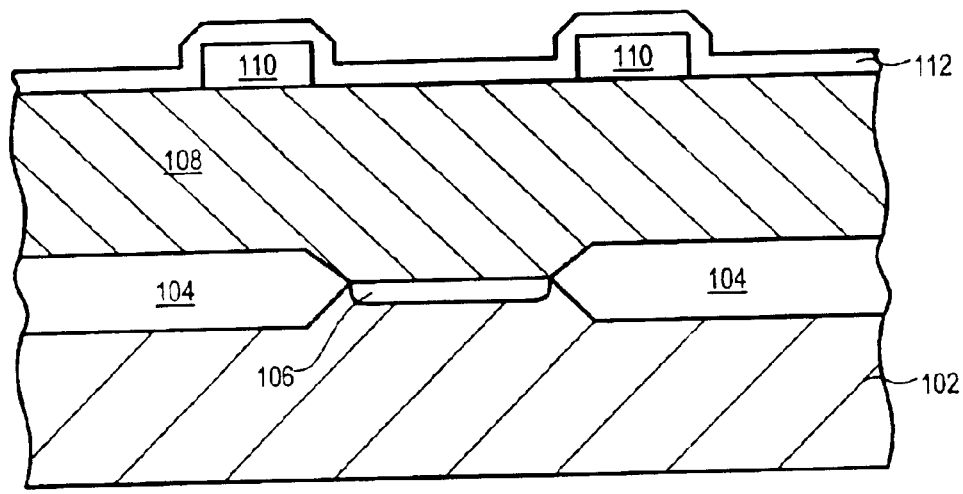

Referring now to FIG. 4, conductive wire layer 126 can be subject to a patterning step to form wires 110. In a DRAM arrangement, wires 110 can be bit lines. A silicon dioxide film 112 may then be formed over the surface of the device.

Figure 5:
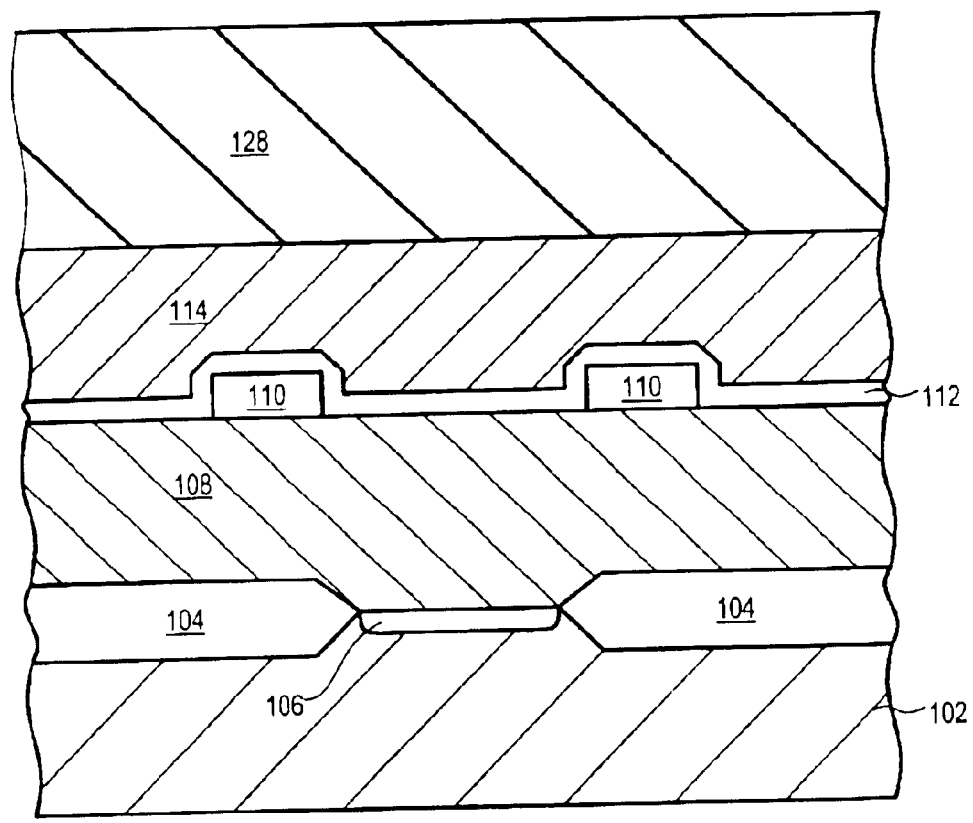

Next, as shown in FIG. 5, a second interlayer insulating film 114 may be formed over silicon dioxide film 112. In one particular arrangement, the second interlayer insulating film 114 may include TEOS-BPSG, like the first interlayer insulating film 108. While the present invention is not limited to such a value, a second interlayer insulating film 114 may have a thickness in the general range of 500 nm, as but one example. The second interlayer insulating film may subsequently be treated to improve surface flatness.

As also shown in FIG. 5, an etch mask layer 128 may be formed over the second interlayer insulating film 114. In one particular arrangement, the etch mask layer 128 may include photoresist formed over the surface of the device.

Figure 6:
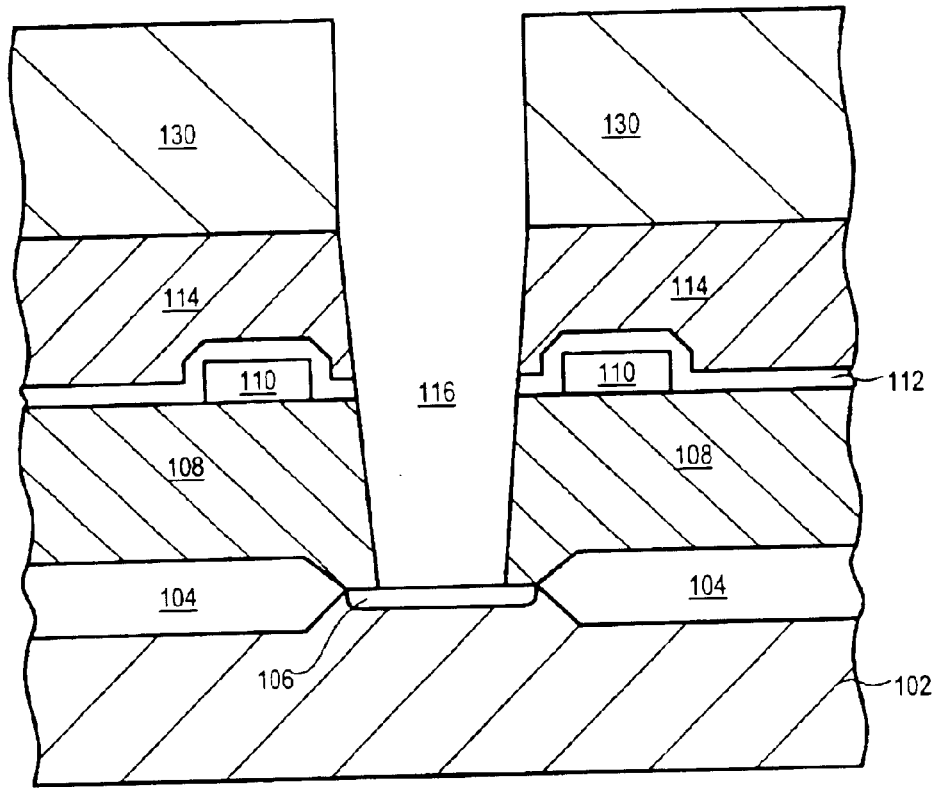

Next, as shown in FIG. 6, the etch mask layer 128 may be patterned by photolithographic techniques to form a mask 130 that may be used form a contact hole. Immediately thereafter, with the mask 130 serving as an etch mask, portions of the second interlayer insulating film 114, silicon dioxide layer 112, and first interlayer insulating film 108 are removed to form a contact hole 116.

The contact hole 116 may expose a portion of diffusion layer 106. In the particular view of FIG. 6, the contact hole 116 has a tapered form. It is understood that this particular form should not be construed as limiting to the present invention, and a contact hole 116 may take other forms. As but one example, a contact hole may have a cylindrical shape.

Figure 7:
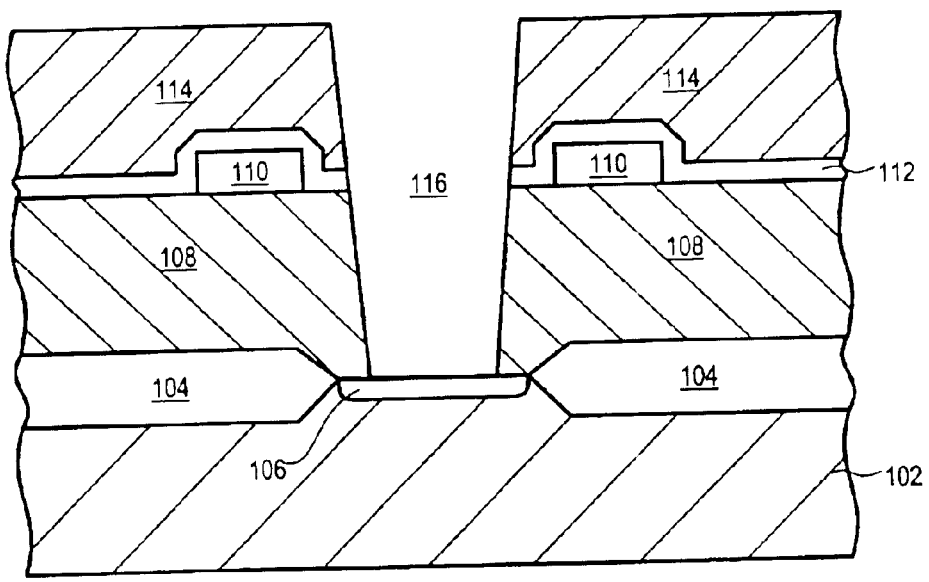

Next, as shown in FIG. 7, the mask 130 may be removed. In addition, the device may be subjected to an annealing treatment. An annealing treatment may allow the diffusion region 106 to recover from damage that may have been inflicted when the contact hole 116 was formed.

Figure 8:
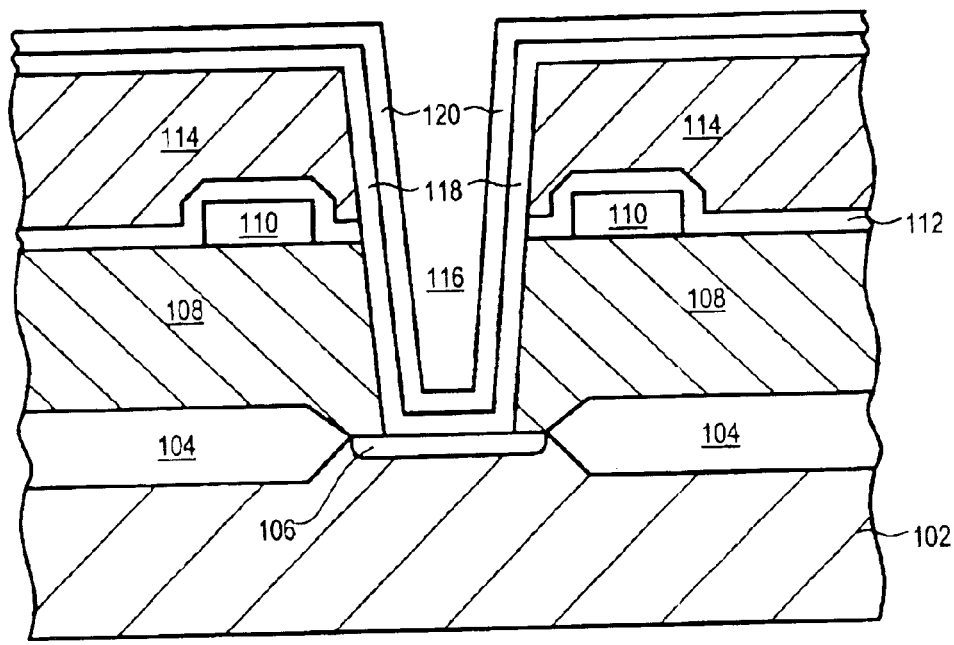

Immediately thereafter, as shown in FIG. 8, a first side-wall film 118 may be formed over the surface of the device. Subsequently, a second side-wall film 120 may be formed on the first side-wall film 118. In one particular arrangement, the first side-wall film 118 can include silicon dioxide and the second side-wall film 120 can include silicon nitride. While the present invention is not limited to such a value, the first side-wall film 118 and second side-wall film 120 may have a thickness in the general range from 300 to 400 nm, more preferably 350 nm when measured above the second interlayer insulating film 114. It is noted that the thickness of the first side-wall film 118 and second side-wall film 120 may be smaller at the bottom of the contact hole 116, as the rate at which such films are formed may be slower within the contact hole 116. It is further noted that the first side-wall film 118 and second side-wall film 120 can have the same or different thickness in various embodiments.

Figure 9:
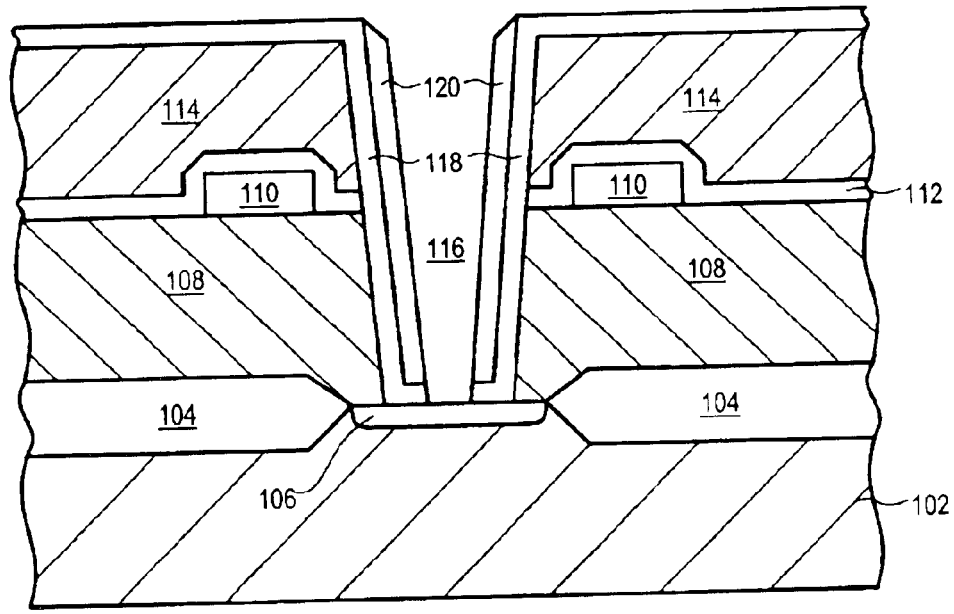

Next, as shown in FIG. 9, the second side-wall film 120 can be partially removed to expose at least a portion of the first side-wall film 118 formed over diffusion layer 106. The partial removal of the second side-wall film 120 can result in portions of the second side-wall film 120 being left over the internal walls of the contact hole 116.

The second side-wall film 120 may be partially removed with a "dry" etch. The etch used to remove the second side-wall film 120 may be selected so as to not substantially etch the first side-wall film 118. In contrast, the etch may also be selected so as to etch the first side-wall film 118.

One skilled in the art would recognize that a "dry" etch can be a plasma etch that is substantially anisotropic.

If an etch is selected that etches the first side-wall film 118, as noted above, the summed thickness of the first and second side-wall films (118 and 120) can be smaller at the bottom of the contact hole 116. Thus, the portion of the first side-wall film 118 over diffusion layer 106 can be removed, exposing portions of the first side-wall film 118. A resulting structure may appear as set forth in FIG. 9.

If an etch is selected that does not substantially remove the first side-wall film 118, etching can be discontinued when a portion of the first side-wall film 118 over the diffusion layer 106 is exposed. A resulting structure may appear as set forth in FIG. 11.

It is noted that if an etch is continued until diffusion layer 106 is exposed (such as shown in FIG. 9), the diffusion layer 106 may sustain damage. Consequently, it may be desirable to subject the diffusion layer 106 to an annealing treatment that can repair such damage.

Figure 11:
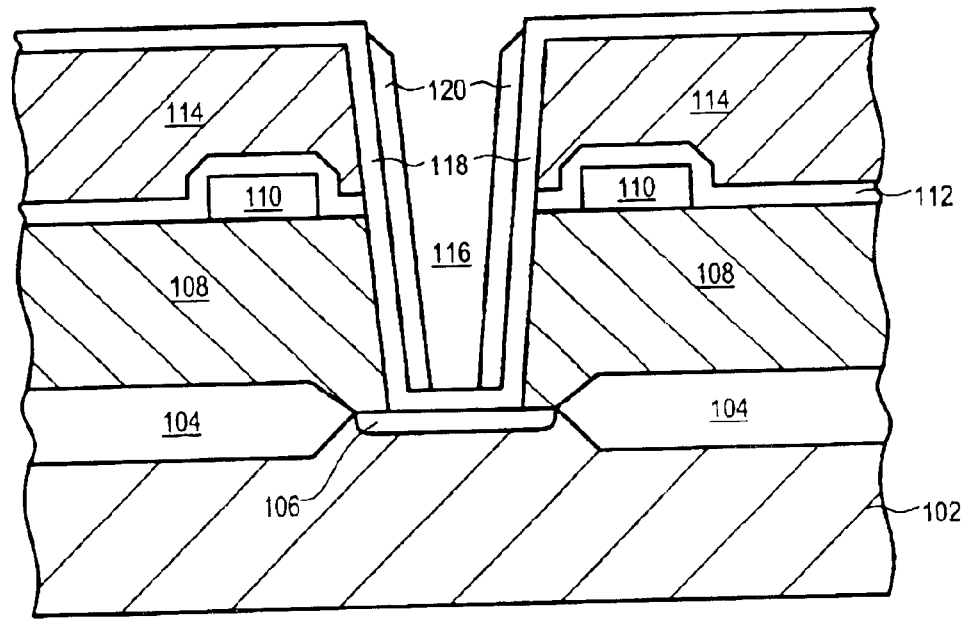
Figure 12:
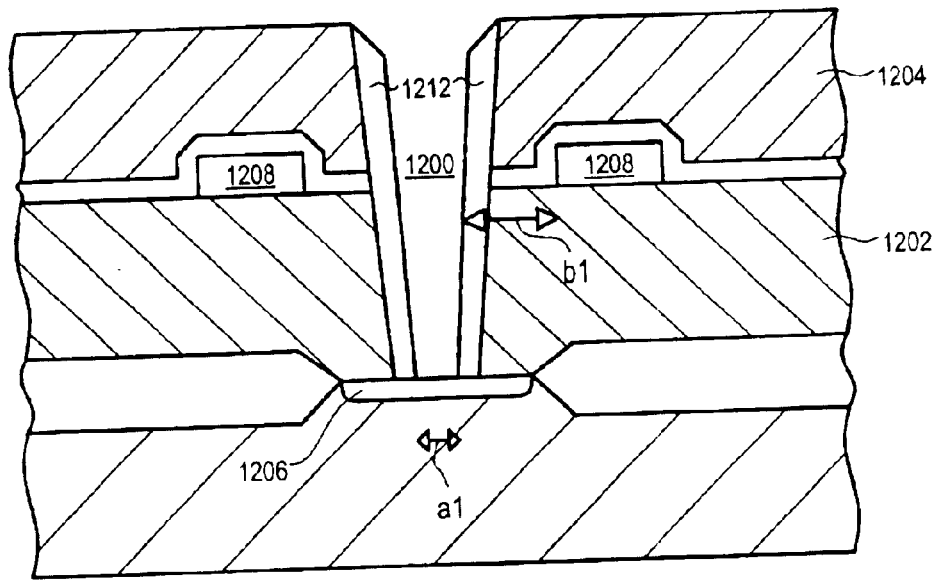
FIGS. 12 to 15 are side cross-sectional views illustrating a conventional semiconductor device.
Figure 13:
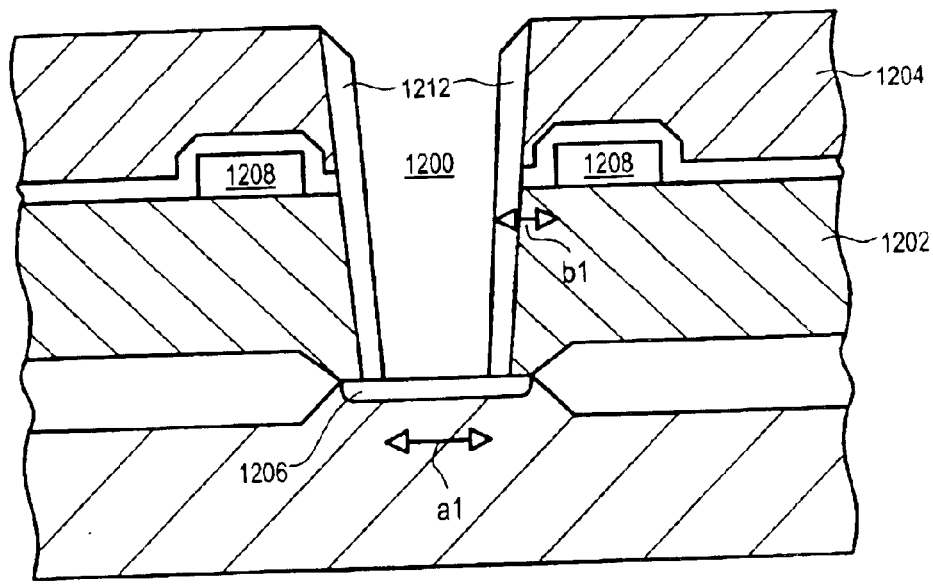
Figure 14:
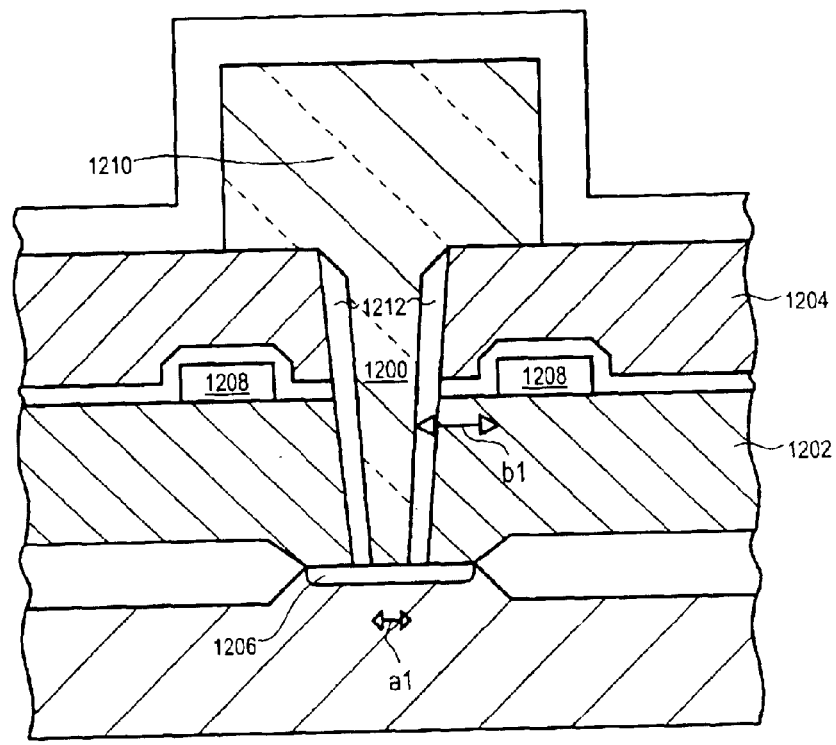
Figure 15:
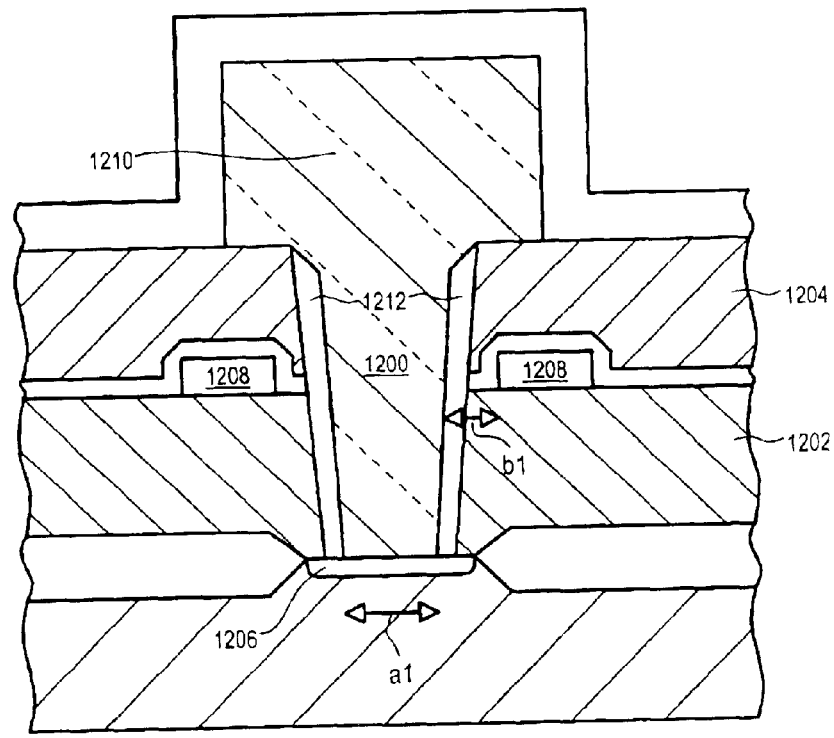

In contrast, if an etch is completed prior to exposing diffusion layer 106 (such as shown in FIG. 11), an annealing treatment mat not be necessary as the etch step may not damage the diffusion layer 106.

Figure 10:
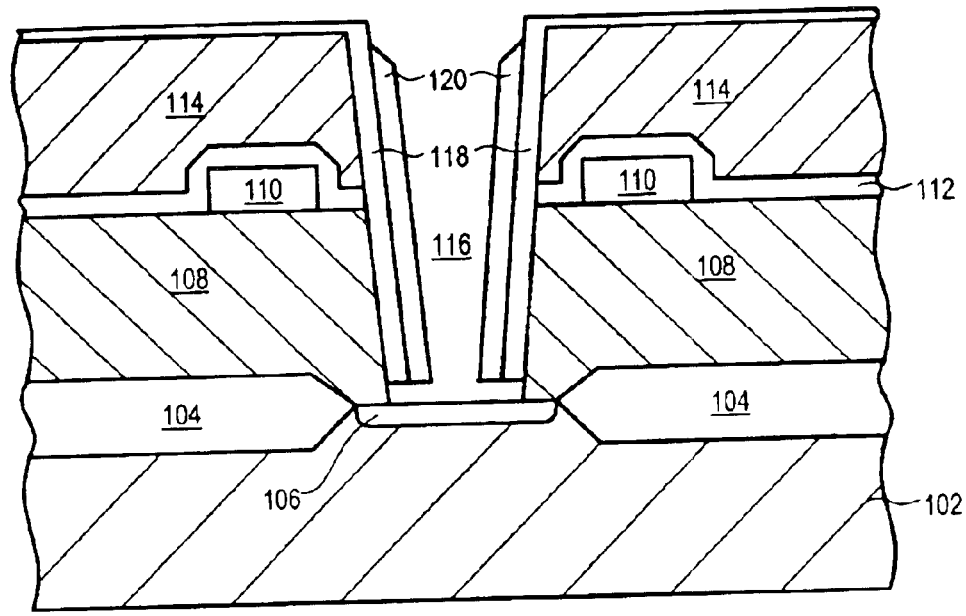

Next, as shown in FIG. 10, exposed portions of the first side-wall film 118 on the bottom of contact hole 116 can be removed, to expose diffusion layer 106. The portions of the first side-wall film 118 on the bottom of contact hole 116 can be removed with an etch that does not substantially remove the second side-wall film 120. Consequently, portions of the first side-wall film 118 that are below the second side-wall film 120 remain intact.

Removing portions of the first side-wall film 118 in the bottom of the contact hole 116 can expose a larger portion of diffusion layer 106, as the diffusion layer 106 is no longer covered by the first and second side-wall films (118 and 120). In particular, the exposed portion of the diffusion layer 106 may return to the same size when the contact hole 116 was first formed. In the particular view of FIG. 10, a certain thickness of the first side-wall film 118 may be left over the second interlayer insulating film 114. However, removal may continue until such portions of the first side-wall film 118 are removed.

In one particular arrangement, an etch to remove portions of the first side-wall film 118 may be a "wet" etch. More preferably, such a wet etch can include hydrofluoric acid (HF). In the event the second side-wall film 120 is silicon nitride, the HF etch will not substantially remove the second side-wall film 120.

One skilled in the art would recognize that a wet chemical etch can be a substantially isotropic etch.

Referring back to FIG. 1, method of manufacture may continue by forming an electroconductive layer 122 in the contact hole. In one particular arrangement, the electroconductive layer 122 can be allowed to grow and extend above first side-wall film 118. (In the event the first side-wall film 118 is completely removed, the electroconductive layer 122 may extend above the second interlayer insulating film 114). In one particular arrangement, the electroconductive layer 122 may include polysilicon. While the present invention is not limited to such a value, the amount by which an electroconductive layer 122 may extend above a first side-wall film 118 (or second interlayer insulating film 114) can be in the general range of 600–800 nm.

In a particular embodiment, an electroconductive layer 122 may be patterned to form the bottom electrode of a capacitor. Such a bottom electrode may be covered by a capacitive insulating layer (not shown). An overlying electrode 124 may then be formed over the device.

As described above, according to a semiconductor device and method of manufacture of the present invention, shorting between wires 110 and electroconductive layer 122 can be prevented with a double-layered side-wall insulating member, while the contact area between the diffusion layer 106 and the electroconductive layer 122 is well preserved. Such area is preserved by removing the double-layered side-wall insulating member from the bottom of contact hole 116. Such an arrangement can resolve previous problems inherent in conventional side-wall contact structures that can lead to increased contact resistance.

According to one aspect of the embodiment, following the formation of a contact hole, a silicon dioxide film and silicon nitride film are formed in that order. However, it is understood that the present invention should not be construed as being limited to particular film types and numbers.

An important aspect of the embodiment can be the different rates at which such side-wall films are etched. In a particular embodiment that includes a first side-wall film of silicon dioxide and a second side-wall film of silicon nitride, wet etching based on HF is employed. However, if side-wall films of different materials are used, etches should be used that can remove an underlying side-wall film but leave an overlying side-wall film essentially intact.

It is also understood that while the above-described embodiment represents a contact hole that may serve as a connection between a capacitive electrode and switching transistor in a DRAM, the invention should not be construed as being limited to such a particular application.

As disclosed above, according to the invention, a side-wall insulating layer formed on the bottom of a contact hole can be removed. The side-wall insulating layer can remain on the internal surface of the contact hole to prevent an electroconductive layer deposited into the contact hole from being short-circuited with an adjacent wire. The removal of the side-wall insulating layer can provide more contact area than conventional approaches. In this way, a relatively spacious margin can be provided between a contact hole and adjacent wires while at the same time providing lower contact resistance than conventional approaches.

One skilled in the art would recognize that while the various embodiments have illustrated a contact to a substrate, a "substrate" is not necessarily limited to an essentially monocrystalline semiconductor substrate. As but one example, a substrate can be a deposited conductive layer.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of forming a semiconductor device, comprising the steps of:
    forming an insulating layer on a substrate;
    forming a contact hole in the insulating layer that exposes a contact portion of the substrate;
    forming a first side-wall insulating film that covers the internal surface of the contact hole and the contact portion of the substrate;
    forming a second side-wall insulating film that covers the first side-wall insulating film;
    removing a portion of the second side-wall insulating film formed over the contact portion of the substrate; and creating a recess under at least the second side-wall insulating film to expose a larger area of the contact portion by removing a portion of the first side-wall insulating film formed over the contact portion of the substrate with a substantially isotropic etch.

2. The method of claim 1, wherein:
the step of forming a first side-wall insulating film includes depositing a film of silicon dioxide; and
the step of forming a second side-wall insulating film includes depositing a film of silicon nitride.

3. The method of claim 1, wherein:
the step of removing a portion of the second side-wall insulating film includes removing the portion of the first side-wall insulating film formed over the contact portion of the substrate to expose a portion of the contact portion of the substrate.

4. The method of claim 1, wherein:
the step of removing a portion of the second side-wall insulating film includes maintaining the portion of the first side-wall insulating film formed over the contact portion substantially intact.

5. The method of claim 1, wherein:
the step of removing a portion of the second side-wall insulating film includes a substantially anisotropic etch.

6. The method of claim 5, wherein:
the substantially anisotropic etch includes a plasma etch.

7. The method of claim 1, wherein:
the substantially isotropic etch includes a wet chemical etch.

8. The method of claim 7, wherein:
the wet chemical etch includes hydrofluoric acid.

9. A method of forming a semiconductor device, comprising the steps of:
forming a contact hole in an insulating layer that exposes a contact portion of a substrate;
forming a first aide-wall insulating film that covers the internal surface of the contact hole and the contact portion of the substrate;
forming a second aide-wall insulating film that covers the first side-wall insulating film;
removing a portion of the second side-wall insulating film formed over the contact portion of the substrate; and
creating a recess under at least the second side-wall insulating film to expose a larger area of the contact portion by etching the first side-wall insulating film formed over the contact portion of the substrate at a faster rate than the second side-wall insulating film.

10. The method of claim 9, wherein:
the step of forming the first side-wall insulating film includes depositing a film comprising silicon dioxide; and
the stop of forming the second side-wall insulating film includes depositing a film comprising silicon nitride.

11. The method of claim 9, wherein:
removing a portion of the second side-wall insulating film includes substantially anisotropically etching the second side-wall insulating film.

12. The method of claim 9, wherein:
removing a portion of the first side-wall insulating film Includes substantially isotropically etching portions of the first side-wall insulating film exposed by etching the second side-wall insulating film.

13. The method of claim 9, further including:
forming the insulating layer over a diffusion layer formed in the substrate.

14. The method of claim 13, further including:
forming the insulating layer includes
forming a first interlayer insulating film,
forming a wiring over the first interlayer insulating film, and
forming a second interlayer insulating film over the wiring layer and the first interlayer insulating film.

15. A method of forming a semiconductor device, comprising the steps of:
forming a contact hole in an insulating layer that exposes a contact portion of a substrate;
forming a laminated film that covers an internal surface of the contact hole and the contact portion of the substrate, the laminated film including a first side-wall insulating film and a second side-wall insulating film;
creating a recess under at least a portion of the laminated film to expose a larger area of the contact portion by removing a portion of the laminated film formed over the contact portion of the substrate; and
forming a conductive layer in the contact hole that covers the exposed area of the contact portion of the substrate.

16. The method of claim 15, wherein:
the step of removing a portion of the laminated film includes etching to remove a portion of the second side-wall insulating film to expose a portion of the first side-wall insulating film.

17. The method of claim 15, wherein:
the step of removing a portion of the laminated film includes etching to remove a portion of the first side-wall insulating film exposed by removing a portion of the second aide-wall insulating film.

18. The method of claim 15, wherein:
the step of removing the portion of the laminated film includes
substantially anisotropically etching the second side-wall insulating film to expose a portion of the first side-wall insulating film, and
substantially isotropically etching the first side-wall insulating film.

19. The method of claim 15, further including:
forming a first capacitor electrode in electrical contact with the conductive layer.

20. The method of claim 15, wherein:
the step of forming the contact hole includes forming the contact hole between two wires formed in the insulating layer.

* * * * *